(12) United States Patent
Lin

(10) Patent No.: US 6,331,940 B1
(45) Date of Patent: Dec. 18, 2001

(54) EXPANSION CIRCUIT BOARD RETAINER

(75) Inventor: Wan-Cheng Lin, Tu-Chen (TW)

(73) Assignee: Hon, Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/434,681

(22) Filed: Nov. 5, 1999

(30) Foreign Application Priority Data

May 28, 1999 (TW) .............................. 88208598 U

(51) Int. Cl.[7] .................................................. H01R 12/16
(52) U.S. Cl. ...................... 361/785; 361/801; 361/802; 439/327; 439/377
(58) Field of Search .................... 361/796, 801, 361/802, 785; 439/327, 377

(56) References Cited

U.S. PATENT DOCUMENTS

| | | | |
|---|---|---|---|
| 4,731,698 | * 3/1988 | Millot et al. .................... | 361/386 |
| 5,216,578 | * 6/1993 | Zenitani et al. .................. | 361/383 |
| 5,822,197 | * 10/1998 | Thuault ........................... | 361/803 |
| 5,943,218 | * 6/1998 | Lin .................................. | 361/801 |
| 6,007,357 | * 12/1999 | Perino et al. .................... | 439/327 |
| 6,056,574 | * 9/1998 | Yeomans et al. ................ | 439/327 |
| 6,168,450 | * 1/1999 | Davis et al. ..................... | 439/327 |

* cited by examiner

Primary Examiner—Brian Sircus
Assistant Examiner—Javaid Nasri
(74) Attorney, Agent, or Firm—Wei Te Chung

(57) ABSTRACT

A expansion circuit board retainer comprises a supporting bracket and an adjustable sleeve. The supporting bracket is secured to a main board and the adjustable sleeve is slidably mounted thereto. The sleeve forms a slot in a wall thereof, through which bolts can extend and screw into corresponding holes of the bracket to adjust the sleeve position. The sleeve also forms pairs of guiding blocks for guiding and receiving an edge of an expansion circuit board. A retaining head is formed at top end of the sleeve, which presses the expansion circuit board downward to secure the expansion circuit board in place.

1 Claim, 6 Drawing Sheets

EXPANSION CIRCUIT BOARD RETAINER

BACKGROUND OF THE INVENTION

1. Field of the Invention

The present invention relates to an expansion circuit board retainer, and particularly to a retainer for holding an expansion circuit board in a computer system.

2. The Related Art

In a conventional computer system, system capability is upgraded through the insertion of expansion circuit boards to a main board. The expansion circuit boards also connect to other components in the computer system. Generally, a computer system includes a plurality of expansion circuit boards disposed in a complex, closely spaced array.

It is often necessary to remove an expansion circuit board to upgrade system capability, to check reliability or to insert a new board that will cause the system to operate differently. Additionally, it is important to ensure that vibrations caused by the system or vibration in the environment in which the system operates will not cause the failure of any electrical connections. Therefore, the expansion circuit boards preferably are both removably and rigidly mounted in the system.

Some developed retainers are designed only for retaining a CPU cartridge packaged in a S.E.C.C. (Single Edge Connection Cartridge) form factor. The CPU cartridge is a rectangular box which encloses an expansion circuit board with a CPU chip therein. The retainer holds two opposite sides of the CPU cartridge, which is designed for holding a box-typed cartridge and can not retain a board-typed expansion circuit board.

The prior art for board-typed expansion circuit board retainers includes a retaining bracket for engaging with a side edge of the expansion circuit board. The retaining bracket has a slot for guiding and positioning the expansion circuit board and a latch at a top end thereof for securing the expansion circuit board. Therefore, the height of the retaining bracket is fixed. Such a prior art board retainer can be seen in U.S. Pat. No. 5,902,143. To change to another expansion circuit board with a second height, a different retainer having a retaining bracket with a second height must be used.

In view of the above shortcomings, a board-typed and height-adjustable expansion circuit board retainer is required.

SUMMARY OF THE INVENTION

An object of the present invention is to provide a board-typed and height-adjustable expansion circuit board retainer.

Another object of the present invention is to provide an expansion circuit board retainer for securely retaining an expansion circuit board.

The present invention discloses an expansion circuit board retainer which comprises a supporting bracket and an adjustable sleeve. The supporting bracket is secured to a main board and the adjustable sleeve is slidably mounted to the supporting bracket. The sleeve forms a sleeve slot in a wall thereof through which bolts can extend and screw into corresponding holes of the bracket to adjust the sleeve position. The sleeve also forms pairs of blocks for guiding and receiving a side edge of an expansion circuit board. A retaining head is formed at a top end of the sleeve, which presses the expansion circuit board downward to secure the expansion circuit board in the bracket.

DETAIL DESCRIPTION OF THE PREFERRED EMBODIMENTS

Figure 1:
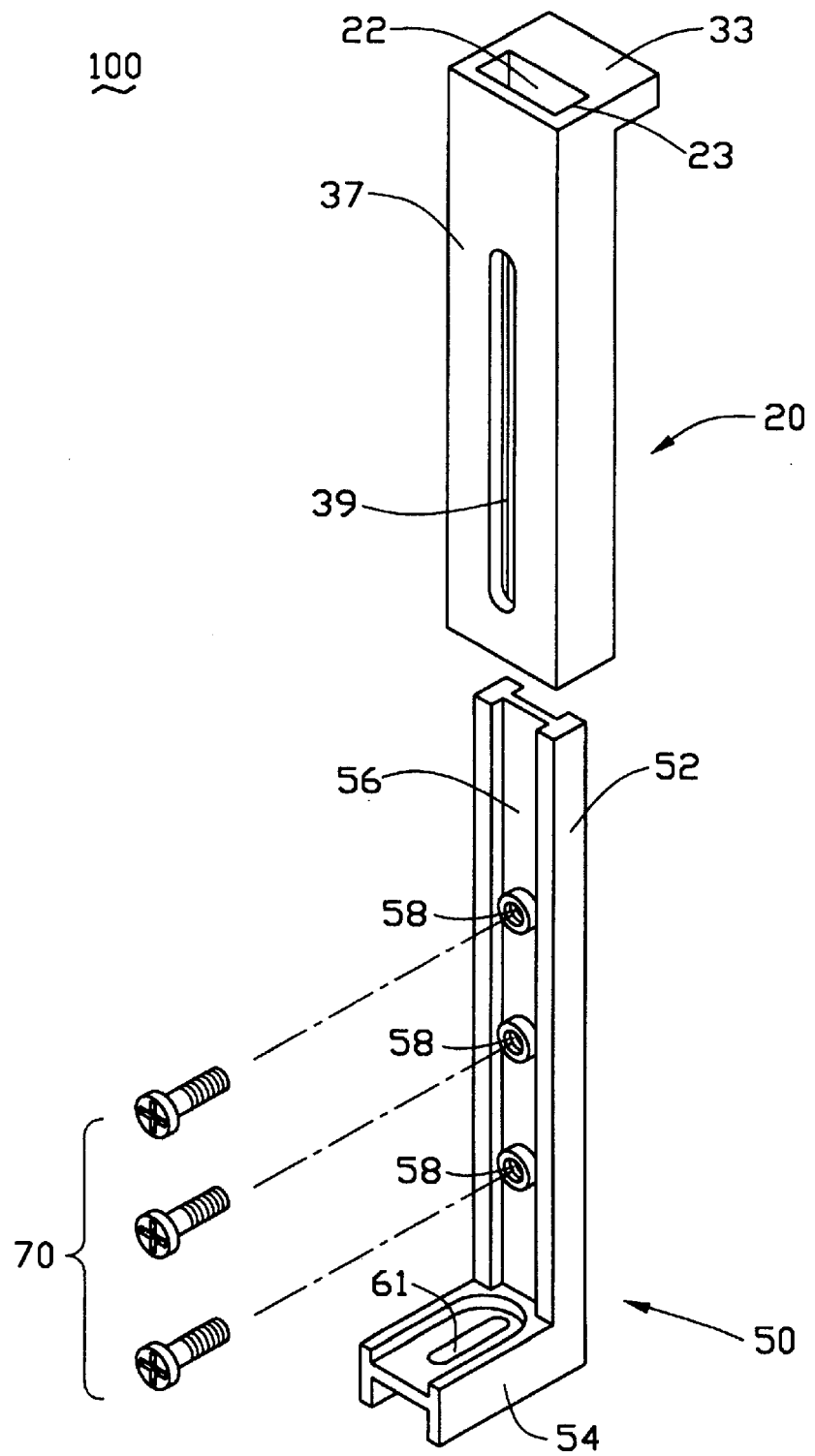
FIG. 1 is an exploded view showing an expansion circuit board retainer in accordance with the present invention.
Figure 2:
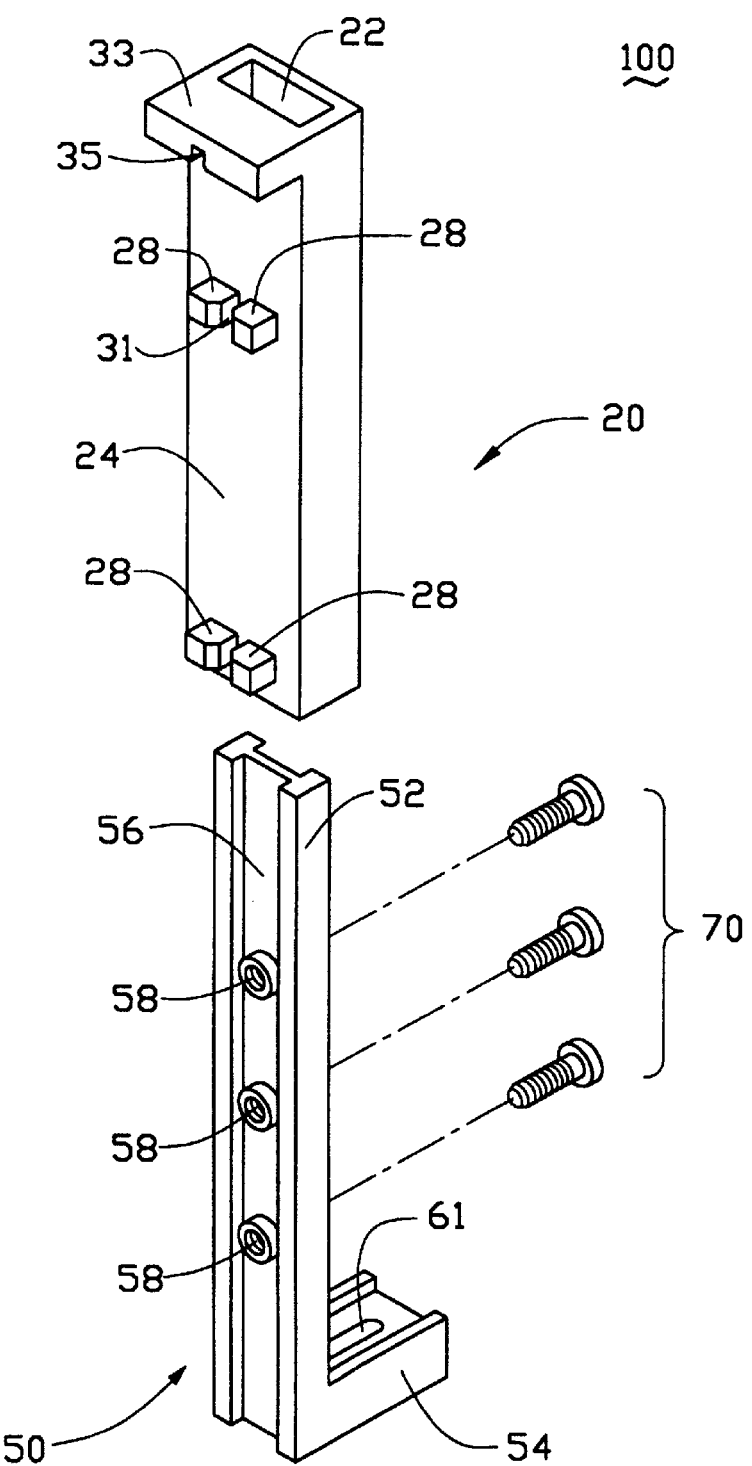
FIG. 2 is another exploded view showing the expansion circuit board retainer in accordance with the present invention.

Referring to FIGS. 1 and 2, an expansion circuit board retainer 100 comprises an adjustable sleeve 20 and a supporting bracket 50. The supporting bracket 50 forms a vertical rail 52 slidably mounting the adjustable sleeve 20 thereto and a horizontal platform 54 mounted to a main board of a computer system (not shown).

The sleeve 20 defines a tunnel 22 along a longitudinal direction and two opposite openings 23 at a top and bottom end thereof (only the opening at top end shown in FIGS. 1 and 2). A wall 37 enclosing the tunnel 22 defines a sleeve slot 39 communicating with the tunnel 22. Pairs of blocks 28 are formed at a surface 24 opposite to the wall 37 of the sleeve 20 and each pair of blocks 28 defines a passageway 31 therebetween. A retaining head 33 is formed at a top end of the sleeve 20, which further defines a groove 35 downwardly disposed.

The vertical rail 52 is I-shaped in cross section and defines two recesses 56 at two opposite sides, wherein three threaded holes 58 are formed in the recesses 56. The horizontal platform 54 defines a bracket slot 61 parallel to the main board of the computer system.

Figure 3:
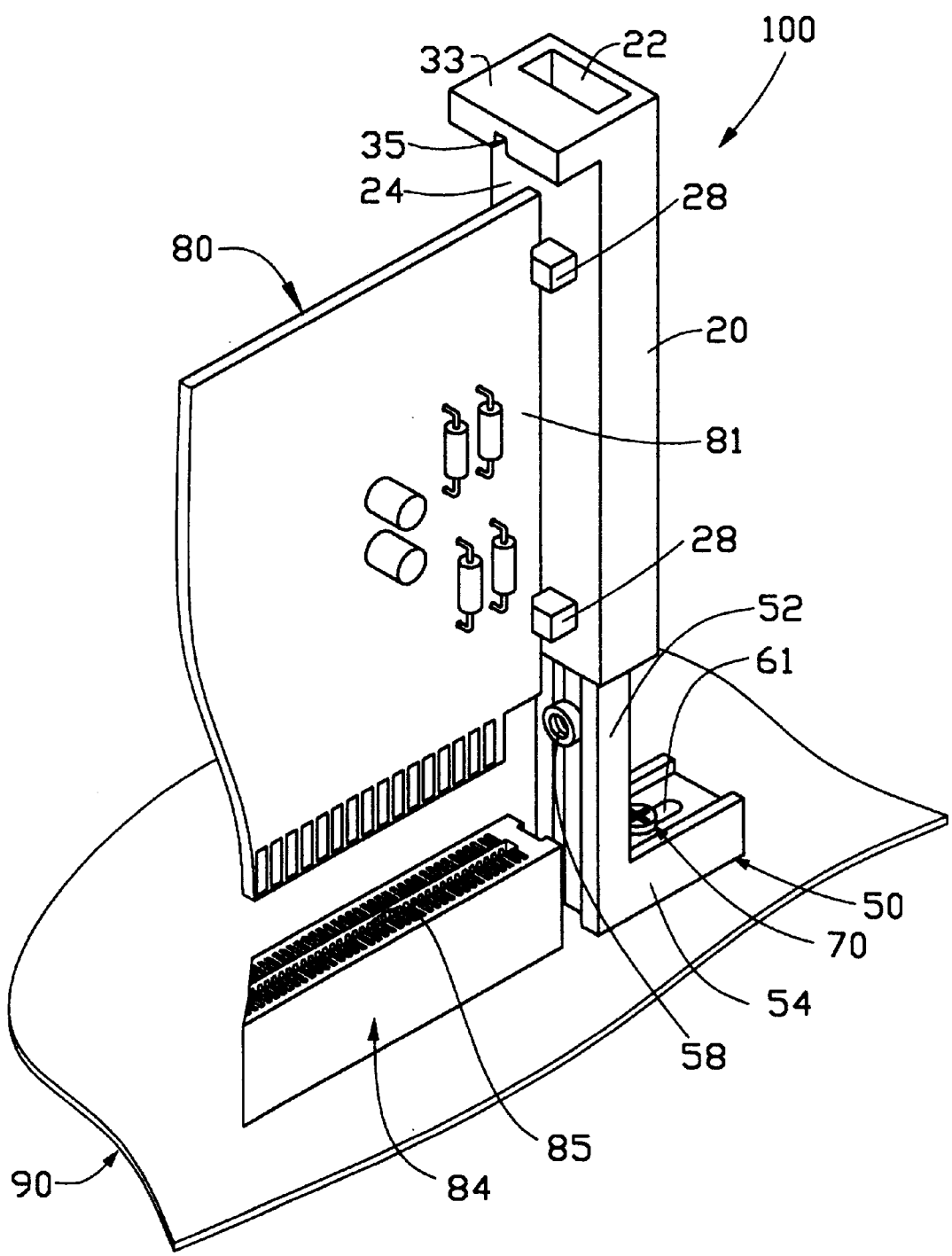
FIG. 3 is a perspective view showing an expansion circuit board assembled to the retainer, wherein the supporting bracket is mounted to a main board and the expansion circuit board has not been fully inserted into a connector mounted on the main board.
Figure 4:
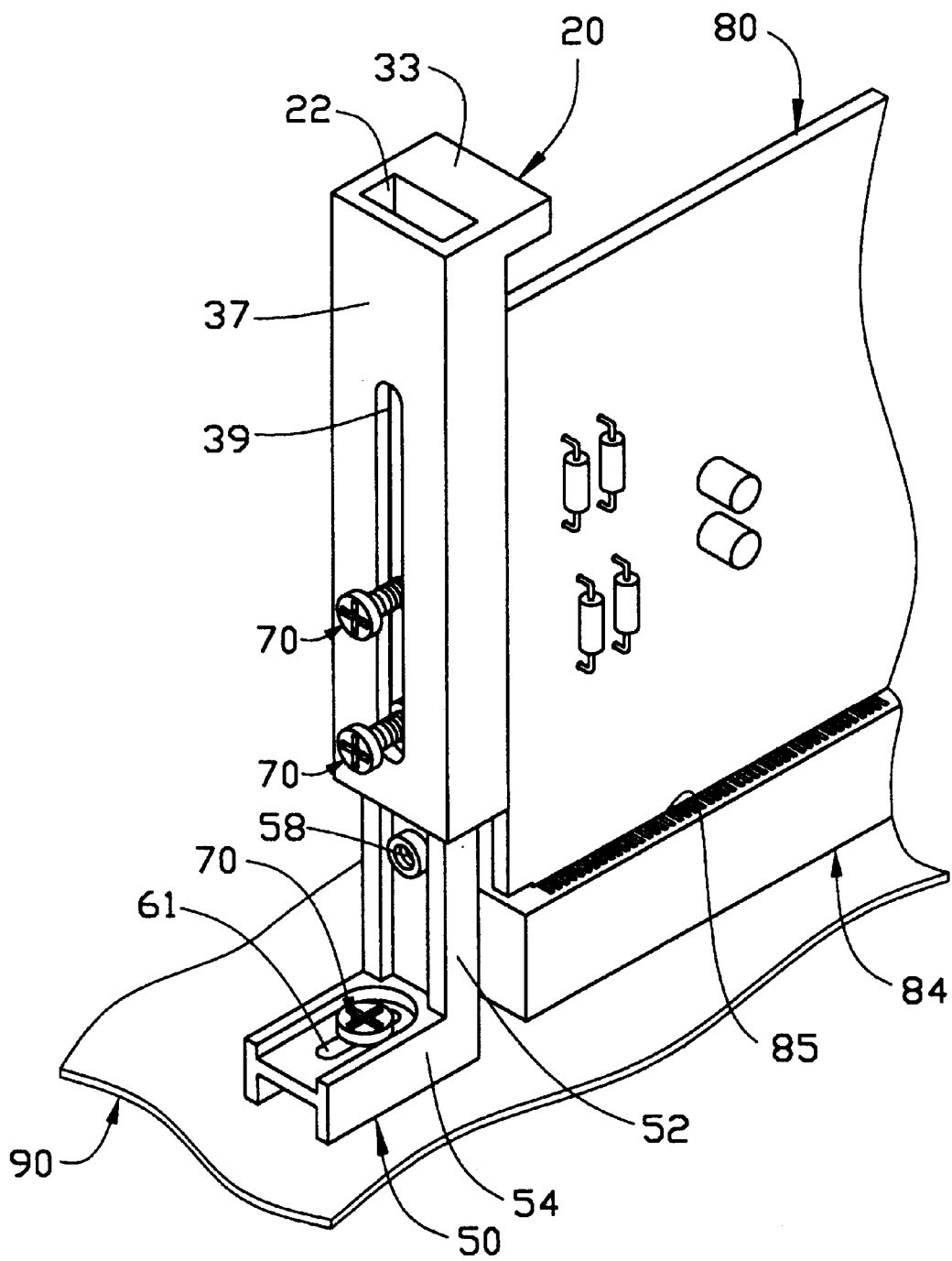
FIG. 4 is another perspective view of FIG. 3.

Referring to FIGS. 3 and 4, the retainer 100 is mounted to a main board 90 to which a board edge connector 84 with a connector slot 85 is also mounted. The supporting bracket 50 is fixed to the main board 90 using a bolt 70 extending through the bracket slot 61 and screwing the horizontal platform 54 to the main board 90. To insert and secure an expansion circuit board 80 to the connector 84, a side edge 81 of the expansion circuit board 80 is positioned in the passageways 31 defined by the spaced blocks 28. To slidably mount the sleeve 20, the rail 52 of the supporting bracket 50 extends through the tunnel 22. The sleeve 20 slides along the rail 52 to align the sleeve slot 39 with the threaded holes 58 and the bolts 70 then extend through the sleeve slot 39 and holes 58 for positioning the sleeve 20 at a proper height.

Figure 5:
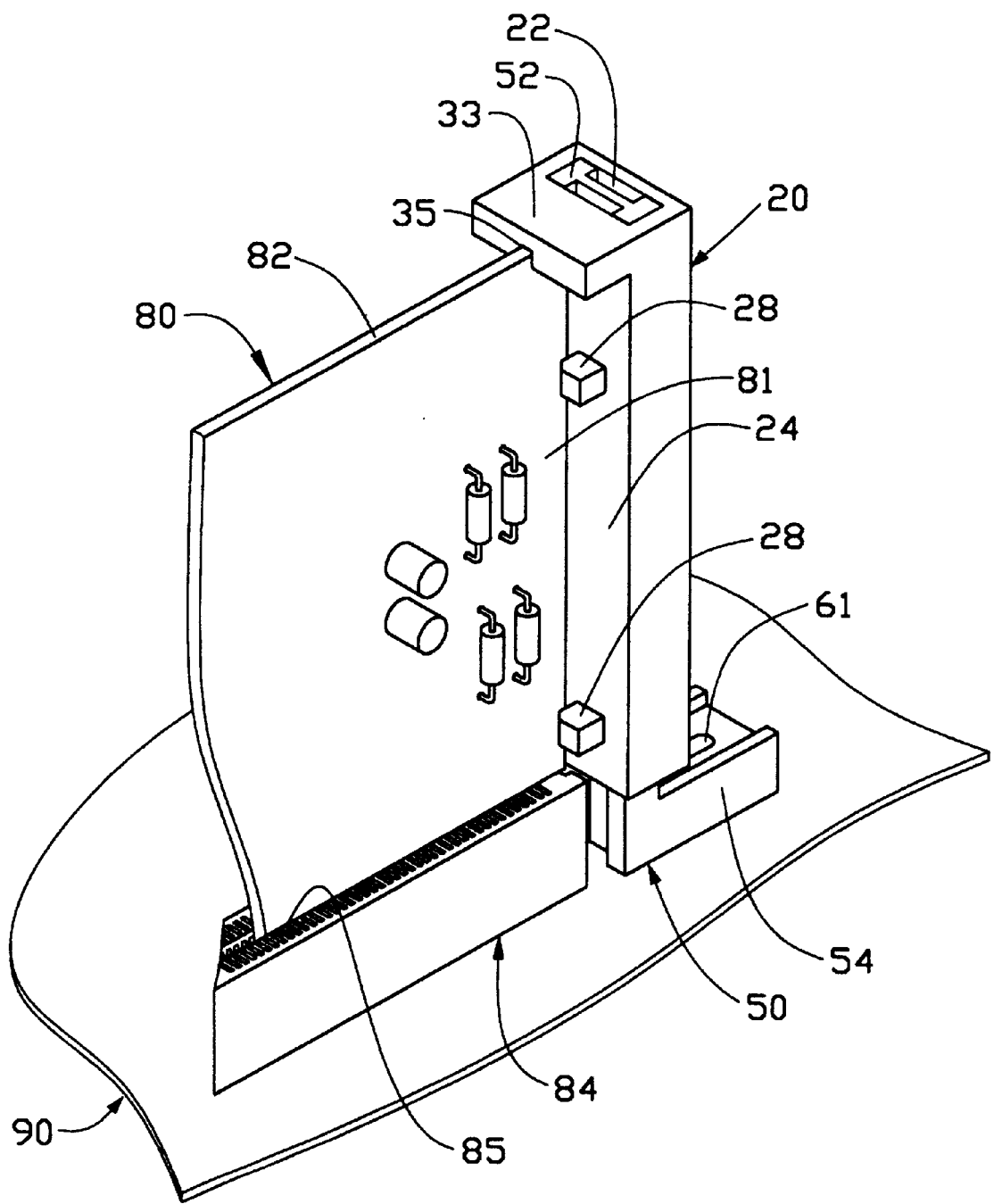
FIG. 5 is a perspective view showing the expansion circuit board assembled to the expansion circuit board retainer.
Figure 6:
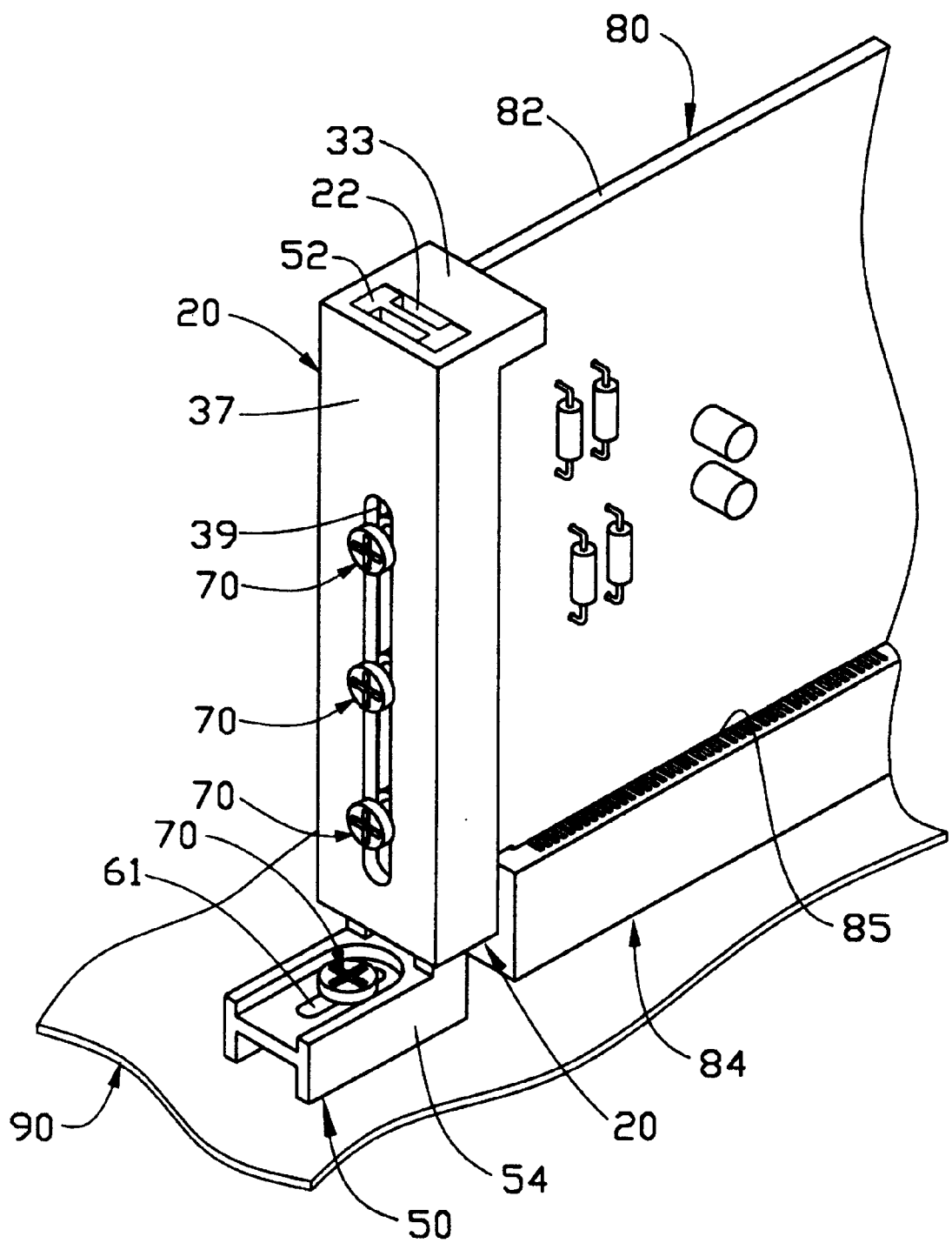
FIG. 6 is another perspective view of FIG. 5.

Referring to FIGS. 5 and 6, the expansion circuit board 80 has been fully inserted into the slot 85 of the connector 84. To retain the expansion circuit board 80, the sleeve 20 slides downward until the groove 35 of the retaining head 33 engages with the top edge 82. The bolts 70 extending through the sleeve slot 39 and threaded holes 58 fix the sleeve 20 to the rail 52 at a proper position corresponding to the height of the expansion circuit board 80.

When a different expansion circuit board with a different height is inserted into the connector 84, the sleeve 20 can slide along the rail 52 to adjust the height of the retaining head 33 to a proper position. The bolts 70 are used to fix and adjust the sleeve 20.

While the present invention has been described in reference to a specific embodiment, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

I claim:

1. An expansion circuit board retainer for adjustably securing expansion circuit boards with various sizes to a main board of a computer system, comprising:

a supporting bracket having a vertical rail and a horizontal platform extending in a first horizontal direction and for securing to the main board, wherein the vertical rail defines at least one threaded hole and the platform is fixed to the main board of the computer system; and an adjustable sleeve defining a tunnel for vertically slidably receiving and being mounted to the vertical rail of the supporting bracket, a slot in a wall of the sleeve and communicating with the tunnel for aligning with the threaded hole and providing at least one bolt extending therethrough to fix the sleeve at a position on the rail, said sleeve forming pairs of spaced blocks adapted to guide a side edge of a corresponding expansion circuit board and a retaining head to press the corresponding expansion circuit board downward for securing thereto; wherein the retaining head extends in a second horizontal direction and defines a groove adapted to engage with a top edge of the corresponding expansion circuit board and press the corresponding expansion circuit board downward to a connector of the main board; wherein each of the pairs of spaced blocks defines a passageway for guiding and receiving the side edge of the corresponding expansion circuit board.

\* \* \* \* \*